(12) United States Patent
Link et al.

(10) Patent No.: US 9,071,222 B2
(45) Date of Patent: Jun. 30, 2015

(54) METHOD FOR FORMING AN ELECTRODE

(75) Inventors: Andreas Link, Munich (DE); Gudrun Henn, Ebenhausen (DE); Rainer Braun, Munich (DE)

(73) Assignee: EPCOS AG, Munich (DE)

( * ) Notice: Subject to any disclaimer, the term of this patent is extended or adjusted under 35 U.S.C. 154(b) by 150 days.

(21) Appl. No.: 13/273,871

(22) Filed: Oct. 14, 2011

(65) Prior Publication Data

US 2012/0091862 A1    Apr. 19, 2012

(30) Foreign Application Priority Data

Oct. 15, 2010  (DE) .......................... 10 2010 048 620

(51) Int. Cl.
*H04R 17/00* (2006.01)
*H03H 9/02* (2006.01)

(52) U.S. Cl.
CPC ............. *H03H 9/02* (2013.01); *Y10T 29/49002* (2015.01); *Y10T 29/42* (2015.01)

(58) Field of Classification Search
USPC ........ 29/592.1, 831, 832, 837, 842, 852, 854, 29/885; 257/527, 133; 607/36, 37, 53, 54, 607/116, 141, 142; 623/24, 25, 6, 53, 900, 623/901, 905–907, 926

See application file for complete search history.

(56) References Cited

U.S. PATENT DOCUMENTS

| | | | |
|---|---|---|---|
| 6,291,290 B1 * | 9/2001 | Arita | 438/240 |
| 6,475,854 B2 * | 11/2002 | Narwankar et al. | 438/238 |
| 6,556,281 B1 * | 4/2003 | Govil et al. | 355/72 |
| 7,439,100 B2 * | 10/2008 | Fauty et al. | 438/123 |
| 7,560,815 B1 * | 7/2009 | Vaartstra et al. | 257/751 |
| 2002/0024271 A1 | 2/2002 | Hori et al. | |
| 2002/0121697 A1 * | 9/2002 | Marsh | 257/751 |
| 2006/0175639 A1 | 8/2006 | Leidl et al. | |
| 2008/0135408 A1 * | 6/2008 | Sjolander | 204/403.01 |

FOREIGN PATENT DOCUMENTS

| | | |
|---|---|---|
| DE | 101 34 748 A1 | 2/2002 |
| DE | 102 06 369 A1 | 8/2003 |

* cited by examiner

*Primary Examiner* — Paul D Kim
(74) *Attorney, Agent, or Firm* — Slater & Matsil, L.L.P.

(57) ABSTRACT

A microacoustic component includes an active layer and an electrode. The electrode includes a first metal layer facing the active layer, a second metal layer facing away from the active layer, and a third layer arranged between the first metal layer and the second metal layer. The third layer serves as a diffusion barrier.

17 Claims, 2 Drawing Sheets

METHOD FOR FORMING AN ELECTRODE

This application claims priority to German Patent Application 10 2010 048 620.5, which was filed Oct. 15, 2010 and is incorporated herein by reference.

TECHNICAL FIELD

The invention relates to an electrode for the electrical contacting of a microacoustic component, to a microacoustic component comprising such an electrode and to a production method for an electrode.

BACKGROUND

Electrodes for the electrical contacting of microacoustic components are known from the prior art. For example, German publication 102 06 369 A1 discloses an electrode structure with improved power compatibility and a method for the production thereof. This reference proposes for a component operating with acoustic waves to arrange the electrode structure over a mechanically stable adaptation layer, which serves for reducing the electromechanical stress.

In general, when selecting electrode materials for microacoustic components, their mechanical, acoustic and electrical properties must be weighed up, in particular their acoustic impedance and electrical conductivity. As a consequence, sometimes layer systems of different metals or metal alloys are used for the electrical contacting of microacoustic components instead of a homogeneous layer. Such multilayered electrode structures are also referred to as sandwich structures.

In particular in the production of microacoustic components, the individual, relatively thin layers are produced by methods known from the area of semiconductor fabrication, such as in particular sputtering or vapor deposition. Further process steps comprise what is known as annealing, which is used, inter alia, to compensate for structural defects by heating the structures which have grown.

Tests have shown that these and further process steps influence the properties of the sandwich structures produced in this way, for example, their conductivity. The action of electrical fields may also have adverse effects on the sandwich structures. In particular, the combined conductivity of such sandwich structures decreases again during the depositing of further layers and also during subsequent processing steps, such as, for example, the annealing of the microacoustic component.

SUMMARY OF THE INVENTION

In one aspect, the present invention describes an improved electrode and a method for the production thereof with which the improved properties of multilayered electrodes are largely retained irrespective of further process steps.

In one embodiment an electrode is provided for the electrical contacting of a microacoustic component. The electrode comprises at least a first metal layer, facing an active layer of the microacoustic component, and a second metal layer, facing away from the active layer of the microacoustic component. The electrode structure is characterized in that a third layer, serving as a diffusion barrier, is arranged between the first metal layer and the second metal layer.

The electrode according to an embodiment of the invention makes use of the realization that a layer serving as a diffusion barrier makes it possible to avoid the formation of alloys of materials of a first metal layer and a second metal layer. In particular, the third layer prevents the diffusion of atoms either of the first layer or of the second layer into the other metal layer, respectively, and consequently prevents undesired alloy formation, which could adversely influence the electrical conductivity of the electrode.

According to an advantageous refinement, the third layer comprises a non-alloy-forming metal, a metallic hard material or a dielectric material. For example, the third layer comprises tungsten (W), titanium nitride (TiN), aluminum oxide ($Al_2O_3$), silicon nitride (SiN), quartz ($SiO_2$) or amorphous silicon (a-Si). The materials mentioned prevent the diffusion of atoms of a first metal layer into a neighboring, second metal layer.

According to a further advantageous refinement, the third layer has a thickness of 2 to 50 nm, preferably 5 to 20 nm. It has been found that such a layer thickness on the one hand prevents diffusion almost completely and on the other hand does not adversely influence the acoustic and/or electrical properties of the electrode structure, or only to a minor extent.

According to a further advantageous refinement, the first metal layer has an improved conductivity in comparison with the second metal layer. The provision of a first metal layer of particularly good conductivity, facing the microacoustic component, makes low-loss surface-area contacting of the microacoustic component possible.

According to a further advantageous refinement, the second metal layer has an improved adhesiveness in comparison with the first metal layer. The simultaneous provision of a second metal layer, which is facing away from the microacoustic component, and an improved adhesiveness allow the multilayered electrode to be reliably grown on a substrate.

According to a further advantageous refinement, the second metal layer may serve for the microstructuring of the electrode and/or the active layer of the acoustic component. The provision of a second metal layer which is suitable for microstructuring particularly allows very thin layers to be produced uniformly.

According to a further advantageous refinement, the electrode is characterized by a fourth conductive layer, arranged between the first metal layer and the active layer of the microacoustic component, the fourth layer having a high acoustic impedance. The provision of a further conductive layer with a high acoustic impedance particularly allows an acoustic resonator for the microacoustic component to be formed.

According to a further aspect of the invention, a description is given of a microacoustic component which comprises at least one active layer of a piezoelectric material and at least a first electrode arranged on the substrate according to one of the above refinements. Such a microacoustic component has improved electrical properties and a high resistance to high temperatures and the action of strong electrical fields.

According to advantageous refinements, the microacoustic component is characterized in that it is formed as an SAW (Surface Acoustic Wave), BAW (Bulk Acoustic Wave), LBAW (Lateral BAW), GBAW (Guided BAW) or MEMS (Micro-Electro-Mechanical System) component. Such components are suitable, for example, for use in high-frequency filters, in particular filters for the radio-frequency range (RF).

According to a further aspect of the invention, a description is given of a production method for an electrode which comprises the following steps:

providing a substrate, applying a first conductive layer of a first alloy-forming metal to a surface of the substrate or a layer lying in between, applying a third layer of a non-alloy-forming material to a surface of the first layer, and applying a second conductive layer of a second alloy-forming metal to a surface of the third layer.

The aforementioned method steps allow the production of an electrode with improved acoustic and/or electrical properties which retains its properties even in subsequent processing steps, in particular during annealing or under the action of electrical fields.

According to different refinements, the electrode may be grown either on a separate carrier substrate or directly on an active layer of a piezoelectric material. It is also possible to grow two electrodes on opposite sides of the active layer.

According to an advantageous refinement, the first, second, third, fourth and/or active layer is applied to the substrate by sputtering or Atomic Layer Deposition (ALD). Sputtering or ALD allows the controlled application of particularly thin layers to a substrate.

According to an alternative refinement, the first, second, third, fourth and/or active layer is applied to the substrate by chemical vapor deposition. Chemical vapor deposition allows the simple and low-cost production of layers.

According to a further refinement, the first, second, third, fourth and/or active layer is microstructured. Suitable for this, for example, are dry etching or else other known wet-chemical methods. Microstructuring allows the properties of the electrode thus produced or of an active layer of a microacoustic component bonded thereto to be further improved.

BRIEF DESCRIPTION OF THE DRAWINGS

The invention is described in more detail below on the basis of an exemplary embodiment with reference to the accompanying figures, in which.

Figure 1A:
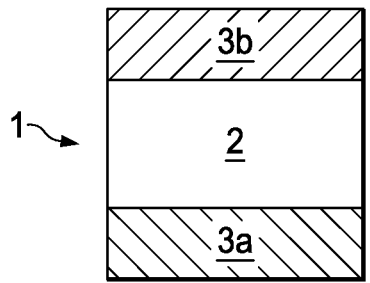
FIG. 1A shows a microacoustic component.

The following list of reference symbols may be used in conjunction with the drawings:
1 microacoustic component
2 active layer
3 electrode
5 first layer
6 second layer
7 further layer
9 third layer
S1-S6 method steps

DETAILED DESCRIPTION OF ILLUSTRATIVE EMBODIMENTS

FIG. 1A shows a microacoustic component 1. The microacoustic component 1 is, for example, what is known as a BAW (Bulk Acoustic Wave) resonator for a high-frequency filter.

The microacoustic component 1 comprises an active layer 2, e.g., a substrate, of a piezoelectric material and an electrode arranged thereunder and thereover, 3a and 3b, for the electrical contacting of the substrate 2. The active layer 2 contains a suitable piezoelectric material and, for example, consists of aluminum nitride or zinc oxide. Other piezoelectric materials which can be deposited by thin-film processes are also suitable.

The structure of the electrodes 3a and 3b is described in more detail below with reference to FIG. 2B.

Together, the substrate 2 and the electrodes 3a and 3b form an acoustic resonator. The resonator may be formed as a membrane which is clamped at the sides and can thus oscillate freely. It may, however, also be deposited directly on a carrier substrate over an acoustic mirror. For this purpose, arranged under the lower electrode 3a are at least two alternating layers with a low acoustic impedance and a high acoustic impedance respectively, which form an acoustic reflector. The lower electrode 3a may in this case form a partial layer of the reflector.

Figure 1B:
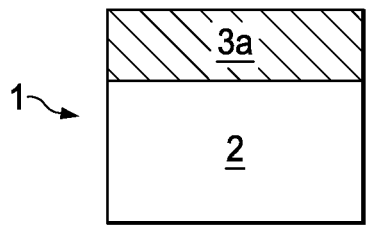
FIG. 1B shows a further microacoustic component.

FIG. 1B shows a further microacoustic component 1. The microacoustic component 1 is, for example, an SAW (Surface Acoustic Wave) component, in particular a high-frequency filter.

The microacoustic component 1 comprises a substrate, which in the exemplary embodiment represented is formed by an active layer 2 of a piezoelectric material, and an electrode 3a arranged thereover. This electrode is formed, for example, as an interdigital structure (not represented in FIG. 1B). The active layer 2 is formed from a suitable crystalline, piezoelectric material, such as, for example, quartz ($SiO_2$). It goes without saying that other piezo materials, such as, for example, $LiTaO_3$ or $LiNbO_3$, may also be used. The structure of the electrodes 3a is described in more detail below with reference to FIG. 2B.

The SAW components may also have other elements, such as, for example, reflectors, pads and connecting lines, which comprise the same structure as the electrodes and may be produced together with them in the same step.

Figure 2A:
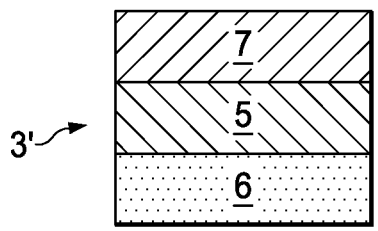
FIG. 2A shows a conventional multilayer electrode.

In FIG. 2A, an electrode 3' for the electrical contacting of the active layer 2 of the microacoustic component 1 is represented. In the exemplary embodiment represented, this electrode is a multilayer electrode. The electrode 3' comprises a first metal layer 5, a second metal layer 6 and a further metal layer 7.

In the exemplary embodiment, the first metal layer 5 consists of an alloy of aluminum and copper (AlCu). This layer has a particularly good electrical conductivity. Instead of AlCu, gold (Au) or silver (Ag) may also be used, for example, in the first metal layer 5. The first metal layer 5 is facing the active layer 2, which is not represented in FIG. 2A.

The second metal layer 6, lying thereunder in FIG. 2A, consists in the exemplary embodiment of titanium (Ti). Titanium has good adhesive properties, which makes it easier for the second metal layer 6 to be applied to a carrier substrate, which is not represented in FIG. 2A.

In addition, titanium has structuring properties. This is of advantage in particular whenever the electrode 3' is first applied to a carrier substrate and only then is an active layer 2 of a piezoelectric material applied on top of the electrode 3'. In this case, the well-defined crystalline structure of the titanium layer can be passed on to the layers lying thereover, and thus improve their structural properties.

In the exemplary embodiment, the further metal layer 7 comprises tungsten (W). Tungsten has a particularly high acoustic impedance and therefore reflects an acoustic wave. The first metal layer 5 or second metal layer 6 preferably has a lower acoustic impedance in comparison. Together, the stack of layers of the electrode 3' then forms part of an acoustic reflector of the microacoustic component.

The layer structure described with respect to FIG. 2A combines the good acoustic properties of the tungsten layer with the good electrical properties of the AlCu layer and the mechanical properties of the titanium layer. If, however, such a stack of layers is exposed to electrical or thermal loads, the aluminum and titanium atoms present in it may diffuse into the crystal lattice of the neighboring layer, so that diffusion alloys of the metals involved form. After annealing, the alloy layer forming results in a poorer conductivity of the electrode 3' as a whole.

Figure 2B:
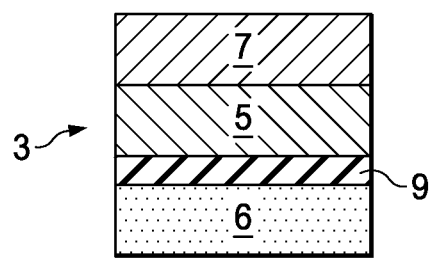
FIG. 2B shows an improved multilayer electrode according to an exemplary embodiment of the invention.

In order to prevent the alloy formation described, in an improved electrode 3, as shown in FIG. 2B, an additional, third metal layer 9 has been arranged between the first metal layer 5 and the second metal layer 6. In the exemplary embodiment, the third metal layer 9 comprises tungsten.

The third metal layer 9 is relatively thin and in the exemplary embodiment has a thickness of only a few nanometers, for example, 5 to 20 nm. Such a thin third metal layer 9 scarcely changes the conductivity of the improved electrode 3 as a whole. At the same time, however, it prevents the diffusion of aluminum or titanium atoms into the crystal lattice of the respectively neighboring metal layer 5 or 6.

Instead of the third metal layer 9 of tungsten, other layers may also be used to prevent alloying of the neighboring metal layers 5 and 6. For example, titanium nitride (TiN), amorphous silicon (a-Si), aluminum oxide (Al2O3), silicon nitride (SiN), or silicon dioxide (SiO2) are also suitable.

Figure 3:
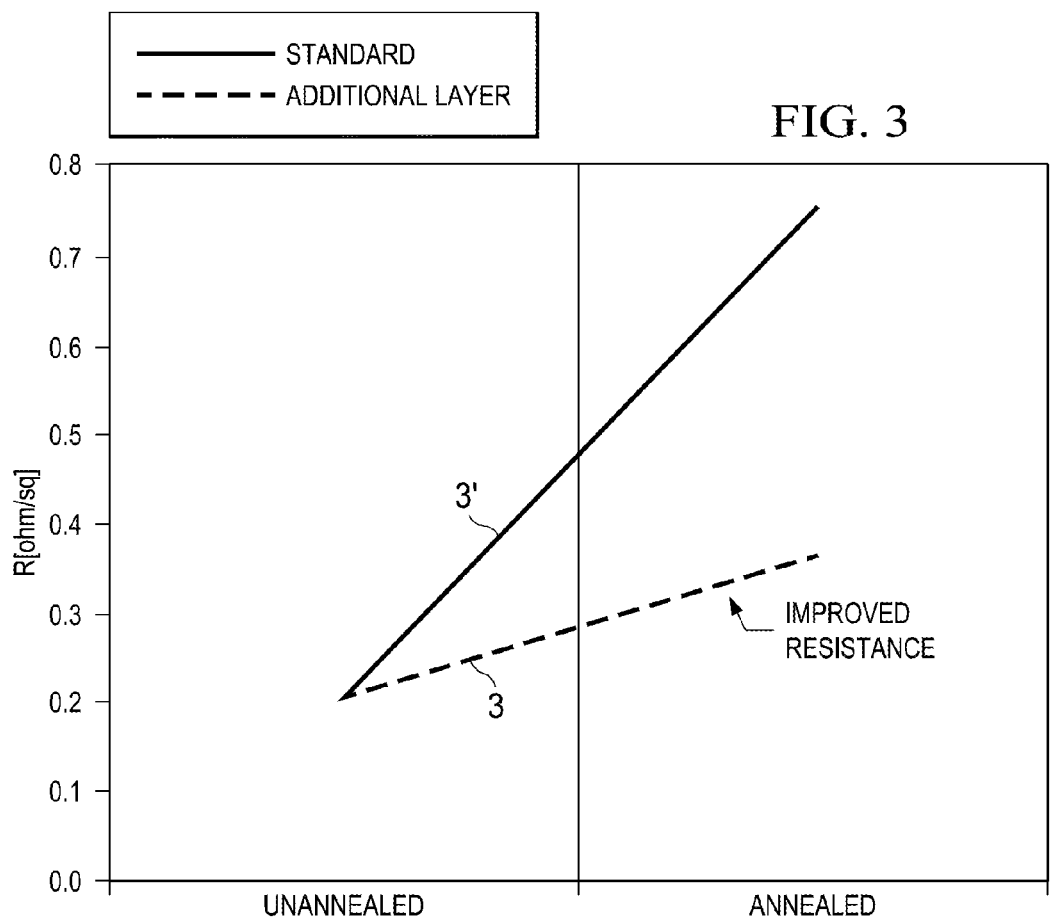
FIG. 3 shows the electrical conductivity of the electrodes as shown in FIGS. 2A and 2B.

Represented on the left in FIG. 3 is the sheet resistance of electrodes which have not been annealed, and represented on the right is the sheet resistance of annealed electrodes.

As FIG. 3 reveals, the sheet resistance of an annealed electrode 3 with an additional third layer 9 is lower than that of an annealed conventional electrode 3' as shown in FIG. 2A. Furthermore, the annealed electrode 3 with the additional third layer 9 has an only slightly higher resistivity value (measured value on the right) than a corresponding, unannealed electrode (measured value on the left). This not only improves the properties of the electrode 3 during production, but also ensures long-term stability of the electrical properties of a microacoustic component 1 bonded to the electrode 3.

Figure 4:
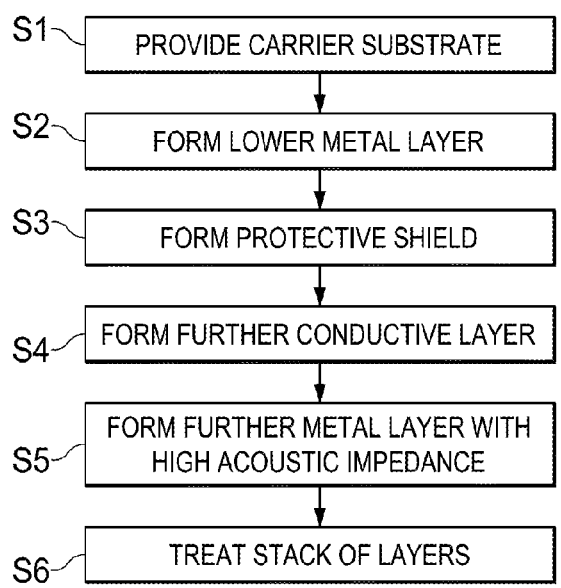
FIG. 4 shows a production method for a microacoustic component.

Represented in FIG. 4 is a production method for an improved electrode 3a as shown in FIG. 2B for a microacoustic BAW component 1 as shown in FIG. 1A.

In a first step S1, a carrier substrate is provided. For example, a carrier substrate of silicon or some other semiconductor substrate is provided. However, a purely mechanical carrier substrate may also be provided for growing the subsequent layers.

In a further step S2, a lower metal layer 6 is produced. In the exemplary embodiment, a titanium layer is applied to the carrier substrate.

In a further step S3, a protective shield is applied to the metal layer 6 to prevent alloy formation. In the exemplary embodiment, a 5 nm thick tungsten layer 9 is sputtered onto the metal layer 6.

In a further step S4, a further metal layer 5, for example, AlCu or Au, is applied to the layer 9. The further conductive layer 5 may also be applied by sputtering.

In a further step S5, a further metal layer 7 with a high acoustic impedance is applied to the layer 5. For example, a tungsten layer is sputtered onto the conductive layer 5.

Together, the layers 6, 9, 5 and 7 form a first improved electrode 3 as shown in FIG. 2B.

It goes without saying that steps S2 to S5 may also be repeated in full or in part, in order to produce more complex sandwich structures. For example, an electrode stack with three alloy-forming metal layers may be produced by two protective layers of non-alloy-forming materials respectively lying in between.

To produce a BAW component, an active layer 2 of a piezoelectric material, for example, aluminum nitride (AlN) or zinc oxide (ZnO), is subsequently applied to the produced first electrode 3a. Subsequently, a further electrode 3b may be applied on the opposite side of the active layer 2, steps S5 to S2 in this case being performed in the opposite sequence.

In a further, optional step S6, the stack of layers or the microacoustic component 1 comprising it is treated further. In particular, the entire stack of layers is annealed. It goes without saying that annealing may also be repeated, for example, carried out once for every layer deposited.

Preferably, all the layers are created one after the other without the stack of layers being removed from a vacuum process chamber in between times. Optionally, further process steps may also be carried out in the same process chamber.

Instead of the BAW component 1 represented and described, it goes without saying that the improved electrode 3 described may also be used in an SAW (Surface Acoustic Wave) component. During its production, in step S1 a substrate of a piezoelectric material itself serves as the carrier substrate to which the electrode 3 is directly applied. For this purpose, steps S4 to S2 are again performed in the opposite sequence.

The electrode structure described is similarly suitable for use in an LBAW component, in which the second electrode 3b has an interdigital structure in the same way as in the case of an SAW component, for use in a GBAW component with an additional layer for waveguiding over an electrode 3 and also for use generally in micro-electromechanical systems (MEMS), in which electrodes used for the electrical contracting are likewise exposed to mechanical, electrical or thermal loads.

What is claimed is:

1. A method for forming a multi-layer electrode for contacting a micro acoustic device comprising:
   providing a substrate;
   applying a first conductive layer of a first alloy-forming metal to a surface of the substrate or a layer lying in between;
   applying a third layer of a non-alloy-forming material to a surface of the first layer, wherein the third layer has a thickness of 2-50 nm and the third layer comprises W, TiN, Al$_2$O$_3$, SiN, SiO$_2$ and/or A-Si;
   applying a second conductive layer of a second alloy-forming metal to a surface of the third layer, wherein the first conductive layer, the third layer and the second conductive layer together form the multi-layer electrode and wherein the third layer serves as a diffusion barrier to prevent diffusion of atoms of the first conductive layer into the second conductive layer and/or diffusion of atoms of the second conductive layer into the first conductive layer, and wherein forming the first conductive layer, the third layer and the second conductive layer comprises forming a part of a micro acoustic component;
   after applying the second conductive layer, applying a fourth conductive layer to the second conductive layer, the fourth conductive layer comprising a material with a high acoustic impedance, wherein an active layer of the micro acoustic device is applied to the fourth conductive layer; and
   wherein:
      the first conductive layer comprises a second metal layer, and
      the second conducive layer comprises a first metal layer arranged closer to the active layer than the first conductive layer.

2. The method according to claim 1, wherein providing the substrate comprises providing a carrier substrate, the method further comprising, after applying the second conductive layer, applying an active layer of a piezoelectric material to the electrode.

3. The method according to claim 2, further comprising, after applying the active layer of a piezoelectric material, applying a second electrode on a side of the active layer opposite from the electrode.

4. The method according to claim 1, wherein providing a substrate comprising providing an active layer of a piezoelectric material.

5. The method according to claim 1, wherein the first conductive layer, second conductive layer, third layer, and/or active layer is applied to the substrate by sputtering, atomic layer deposition or chemical vapor deposition.

6. The method according to claim 1, wherein the first conductive layer, second conductive layer, third layer, and/or active layer is microstructured.

7. The method according to claim 1, wherein the third layer has a thickness of 2 to 20 nm.

8. The method according to claim 1, wherein the first metal layer has a higher conductivity as compared to the second metal layer.

9. The method according to claim 1, wherein the second metal layer has increased adhesiveness as compared to the first metal layer.

10. The method according to claim 1, wherein the second metal layer serves for microstructuring of the electrode.

11. The method according to claim 1, wherein the active layer comprises a piezoelectric material.

12. The method according to claim 1, further comprising forming a second electrode arranged on a side of the active layer opposite from the electrode.

13. The method according to claim 1, wherein the micro acoustic component comprises a SAW, BAW, LBAW, GBAW or MEMS component.

14. A method for forming a multi-layer electrode comprising:
providing a substrate;
applying a first conductive layer of a first alloy-forming metal to a surface of the substrate or a layer lying in between;
applying a third conductive layer of a non-alloy-forming metal to a surface of the first layer, wherein the third layer has a thickness of 2-50 nm;
applying a second conductive layer of a second alloy-forming metal to a surface of the third layer, wherein the first conductive layer, the third conductive layer and the second conductive layer are all electrically connected together to form electrode layers of the multi-layer electrode and wherein the third conductive layer serves as a diffusion barrier to prevent diffusion of atoms of the first conductive layer into the second conductive layer and/or diffusion of atoms of the second conductive layer into the first conductive layer, and wherein forming the first conductive layer, the third conductive layer, and the second conductive layer comprises forming a part of a micro acoustic component; and
applying a fourth conductive layer to the second conductive layer, the fourth conductive layer comprising a material with a high acoustic impedance.

15. The method of claim 14, wherein an active layer of the micro acoustic component is applied to the fourth conductive layer.

16. The method of claim 15, wherein the second conductive layer comprises a first metal layer, and the first conducive layer comprises a second metal layer arranged further from the active layer than the second conductive layer.

17. The method of claim 14, wherein the third conductive layer comprises W.

* * * * *